(12) United States Patent
Dougherty (10) Patent No.: US 10,725,844 B2
(45) Date of Patent: Jul. 28, 2020

(54) AUTOMATED BOOT FAILURE PREVENTION AND RECOVERY CIRCUIT AND RELATED METHOD

(71) Applicant: Foxconn eMS, Inc., Houston, TX (US)

(72) Inventor: Dale Russell Dougherty, Kingwood, TX (US)

(73) Assignee: Foxconn eMS, Inc., Houston, TX (US)

( * ) Notice: Subject to any disclaimer, the term of this patent is extended or adjusted under 35 U.S.C. 154(b) by 144 days.

(21) Appl. No.: 15/802,996

(22) Filed: Nov. 3, 2017

(65) Prior Publication Data

US 2018/0121277 A1 May 3, 2018

Related U.S. Application Data

(60) Provisional application No. 62/417,003, filed on Nov. 3, 2016.

(51) Int. Cl.
| | |
|---|---|
| *G06F 11/00* | (2006.01) |
| *G06F 11/07* | (2006.01) |
| *G11C 11/417* | (2006.01) |
| *G06F 1/26* | (2006.01) |
| *G06F 11/22* | (2006.01) |
| *G06F 11/30* | (2006.01) |
| *G11C 7/20* | (2006.01) |
| *G11C 7/02* | (2006.01) |

(52) U.S. Cl.
CPC ............ *G06F 11/0727* (2013.01); *G06F 1/26* (2013.01); *G06F 11/0793* (2013.01); *G06F 11/22* (2013.01); *G06F 11/3058* (2013.01); *G11C 7/02* (2013.01); *G11C 7/20* (2013.01); *G11C 11/417* (2013.01)

(58) Field of Classification Search
CPC .. G06F 11/0727; G06F 11/0793; G06F 11/22; G06F 11/3058; G06F 1/26; G11C 7/02; G11C 7/20; G11C 11/417
See application file for complete search history.

(56) References Cited

U.S. PATENT DOCUMENTS

| | | | |
|---|---|---|---|
| 6,253,319 B1 * | 6/2001 | Tran .......................... | G06F 1/26 713/1 |
| 2003/0236928 A1 * | 12/2003 | Wang ........................ | G06F 1/24 710/8 |

(Continued)

*Primary Examiner* — Joseph D Manoskey
(74) *Attorney, Agent, or Firm* — ScienBiziP, P.C.

(57) ABSTRACT

An automated boot failure prevention and recovery circuit includes one or more non-transitory computer-readable media having computer-executable instructions embodied thereon, a processor coupled to the one or more non-transitory computer-readable media, and configured to execute the computer-executable instructions to electrically disconnect a memory from a power source, short the memory to ground for a predetermined period of time to adjust memory content from a stochastic state to a machine-tolerable state or an acceptable non-failure state. The processor is further configured to execute the computer-executable instructions to electrically disconnect the memory from the ground, and electrically reconnect the memory to the power source. The processor is further configured to execute the computer-executable instructions to apply a load across the power source, acquire power source information, and notify the user of the battery charge status to preclude loss of memory data.

17 Claims, 8 Drawing Sheets

(56) References Cited

U.S. PATENT DOCUMENTS

| | | | | |
|---|---|---|---|---|
| 2007/0164774 A1* | 7/2007 | Cecchi | ............... | G01R 31/2853 |
| | | | | 324/762.09 |
| 2008/0151456 A1* | 6/2008 | Julicher | .................... | G06F 1/28 |
| | | | | 361/93.4 |
| 2008/0229087 A1* | 9/2008 | Li | ........................... | G11C 7/20 |
| | | | | 713/1 |
| 2008/0273550 A1* | 11/2008 | Dandekar | ........... | G06F 11/0793 |
| | | | | 370/465 |
| 2009/0147613 A1* | 6/2009 | Lee | ....................... | G11C 11/417 |
| | | | | 365/228 |
| 2011/0296161 A1* | 12/2011 | Xiao | ......................... | G06F 1/24 |
| | | | | 713/100 |
| 2013/0057324 A1* | 3/2013 | Tu | ........................... | G11C 7/20 |
| | | | | 327/143 |

* cited by examiner

AUTOMATED BOOT FAILURE PREVENTION AND RECOVERY CIRCUIT AND RELATED METHOD

CROSS-REFERENCE TO RELATED APPLICATION(S)

The present application claims the benefit of and priority to a provisional U.S. Patent Application Ser. No. 62/413,003 filed Nov. 3, 2016, entitled "Electronic Device and Method for Automated Reset and Recovery System."

BACKGROUND

Electronic devices, such as servers and personal computers, store system settings by way of a non-volatile random access memory (NVRAM) and incorporate a battery power source to retain the system settings. NVRAMs are typically implemented using static random access memory (SRAM) integrated circuits (ICs) or chips that comprise complementary metal oxide semiconductor (CMOS) transistors or bipolar junction transistors (BJTs). However, electronic devices with NVRAMs are susceptible to boot failures when being powered on. For example, during boot-up, an electronic device may read unexpected data values from the SRAM or find a boot block corruption, which can lead to a failure to boot the operating system of the electronic device.

One of the main contributing factors to boot failures is corrupted SRAM memory cells in the SRAM. For example, an SRAM IC or chip may include an array of SRAM memory cells (e.g., six-transistor memory cells), each representing a bit and having cross-coupled inverters and access transistors. Each of the inverters drives one of two state nodes. When a SRAM memory cell is not powered, both of the state nodes are held at an unstable state, as the state nodes are both discharged. When power is applied, the two state nodes of each SRAM memory cell should each transition to one of the two stable states "0" or "1". However, when the electronic device is powered on, the two state nodes of one or more SRAM memory cells may remain in the unstable state, or transition to the wrong stable state, for example, due to noises (e.g., parasitic electron charges) in the SRAM memory cells. As a result, the battery-backed SRAM content is placed into a stochastic state (e.g., corrupt or hung), which prevents the main logic board (e.g., motherboard) of the electronic device from performing a normal boot-up sequence. In addition, boot failures may be attributed to other factors such as Real-Time Clock (RTC) latch-up and battery power source failure.

For a long time, research and development (R&D), product engineers, and technicians have dealt with this issue of the main logic board (MLB) not powering up even though everything looked right: AC power would be applied, auxiliary (AUX) or standby power would be present, but the MLB would not boot up the system. This occurs in a fraction of systems, making it unnoticeable by typical end users. However, it is noticeable to someone tasked with testing MLBs ranging from prototype, through pilot, and into production on a day-to-day basis. Conventionally, one way of repairing the problem of corrupt SRAM memory cells or RTC lock-up, would require a person to remove all power, remove the battery which supports the SRAM, reinstall the battery, and most of the time the electronic device would power up completely as normal and never experience the problem again. However, this process of repairing the problem is a very time consuming one, especially in large scale server implementations or cases where the computers are not readily accessible. In addressing this issue, many companies or users must resort to tech service calls which could cost companies or users hundreds of dollars per affected system.

Thus, there is a need in the art for cost effective and efficient ways to prevent and/or recover from boot failures.

SUMMARY

The present disclosure is directed to an automated boot failure prevention and recovery circuit and related method, substantially as shown in and/or described in connection with at least one of the figures, and as set forth in the claims.

BRIEF DESCRIPTION OF THE DRAWINGS

The present technology, as well as a preferred mode of use, further objects, and advantages thereof, will best be described with reference to the following detailed description in conjunction with the accompanying drawings.

DETAILED DESCRIPTION

The following description contains specific information pertaining to implementations in the present disclosure. The drawings in the present application and their accompanying detailed description are directed to merely exemplary implementations. It will be appreciated that for simplicity and clarity of illustration, where appropriate, reference numerals have been repeated among the different figures to indicate corresponding or analogous elements. In addition, numerous specific details are set forth in order to provide a thorough understanding of the implementations described herein. However, it will be understood by those of ordinary skill in the art that the implementations described herein can be practiced without these specific details. In other instances, methods, procedures, and components have not been described in detail so as not to obscure the related relevant feature being described. Also, the description is not to be considered as limiting the scope of the implementations described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

The use of the term "IC" in the present disclosure is meant to apply broadly and to refer to all semiconductor fabricated circuitry and devices of which only a partial list includes microprocessors, microcontrollers, graphic processors, network processors, programmable logic devices (PLDs), programmable logic arrays (PLAs), programmable array logics (PALs), field-programmable gate arrays (FPGAs), complex programmable logic devices (CPLDs), dynamic random access memory (DRAM), Flash, Microelectromechanical systems (MEMS), sensors, photo-sensor arrays, charge-coupled devices (CCDs), baseband processors, content addressable memories (CAMs), configurable and reconfigurable circuits, passive circuit arrays, analog circuits, hybrid circuits and mixed signal circuits. Other varieties of programmable ICs may include programmable circuitry in which a circuit design may be implemented responsive to loading a stream of configuration data in combination with one or more other circuits and/or systems, for example, an application specific integrated circuit (ASIC) or a system-on-chip.

Figure 1:
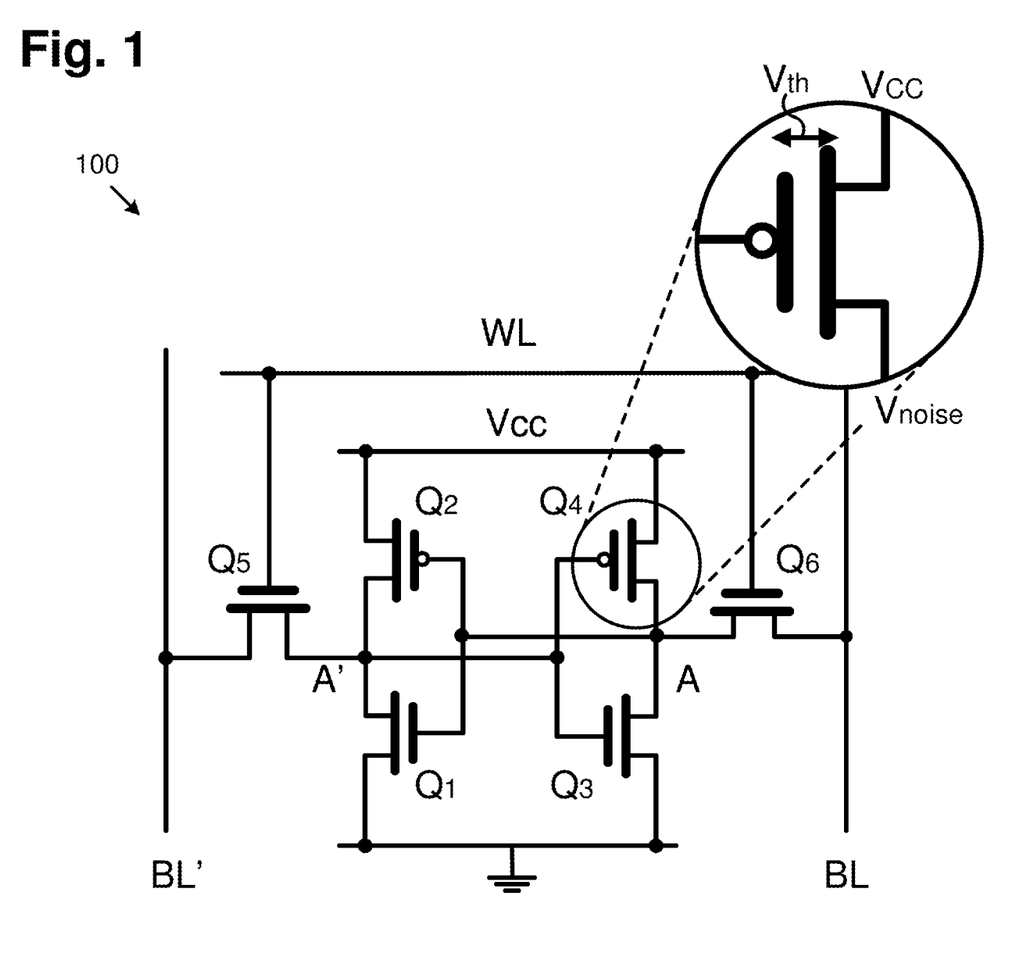
FIG. 1 illustrates a schematic circuit diagram of a SRAM memory cell, in accordance with to an exemplary implementation of the present application.

Referring now to FIG. 1, FIG. 1 illustrates a schematic circuit diagram of a SRAM memory cell, in accordance with to an exemplary implementation of the present application. SRAM memory cell 100 is placed at a cross point of a complementary bit line (BL) pair of first and second bit lines BL and BL' and word line WL.

In the present implementation, driver transistors Q1 and Q3 have their source terminals coupled to a reference voltage, such as ground. Load transistors Q2 and Q4 have their source terminals coupled to a power bus $V_{CC}$. Driver transistor Q1 and load transistor Q2 have their drain terminals coupled to each other at state node A' to form a first inverter. Similarly, driver transistor Q3 and load transistor Q4 have their drain terminals coupled to each other at state node A to form a second inverter. State node A' is coupled to the gate terminals of driver transistor Q3 and load transistor Q4, while state node A is coupled to the gate terminals of driver transistor Q1 and load transistor Q2. As such, the first and the second inverters form a flip-flop circuit.

As illustrated in FIG. 1, access transistors Q5 and Q6 are configured to connect SRAM memory cell 100 to word line WL. Access transistor Q5 has its gate terminal coupled to word line WL, and one of its source/drain terminal coupled to bit line BL', and the other one of its source/drain terminal coupled to state node A'. Access transistor Q6 has its gate terminal coupled to the word line, and one of its source/drain terminal coupled to bit line BL, and the other one of its source/drain terminal coupled to state node A. As such, access transistors Q5 and Q6 selectively activate the flip-flop circuit. In this manner, SRAM memory cell 100 selectively loaded with a write-in datum as a stored datum by cooperation of the word line WL and the bit line pair and is read to produce the stored datum as a read-out datum.

It should be noted that a SRAM may include a plurality of SRAM memory cells arranged in one or more matrices along a plurality of word lines and a plurality of bit line pairs. In the one implementation, each bit of the SRAM may be represented by a six-transistor memory cell, such as SRAM memory cell 100 in FIG. 1. Each of the inverters drives one of state nodes A and A'. When SRAM memory cell 100 is not powered, both state nodes A and A' are discharged low. When power is applied to SRAM memory cell 100, the state nodes A and A' should transition to one of two stable states, "1" or "0". However, due to factors such as process variation mismatch and noise conditions in the SRAM circuit, some SRAM memory cells do not have a strong tendency to transition to either "1" or "0", and can power-up to either "0" or "1". When the electronic device is powered on, the two state nodes (e.g., nodes A and A') of one or more SRAM memory cells (e.g., SRAM memory cell 100) may remain in the unstable state, or transition to the wrong stable state, for example, due to noises (e.g., parasitic charges) in the SRAM. As a result, the battery-backed SRAM content is placed into a stochastic state (e.g., corrupt or hung), which prevents the electronic device from performing a normal boot-up sequence. In addition, boot failures may be attributed to other factors such as Real-Time Clock (RTC) latch-up and battery power source failure.

In one implementation, access transistors Q5 and Q6 and driver transistors Q1 and Q3 may be n-channel MOSFETS, while load transistors Q2 and Q4 are p-channel MOSFETs. In another implementation, access transistors Q5 and Q6 and driver transistors Q1 and Q3 may be p-channel MOSFETS, while load transistors Q2 and Q4 are n-channel MOSFETs. In yet another implementation, transistors Q1 through Q6 may be bipolar junction transistors (BJTs).

Figure 2A:
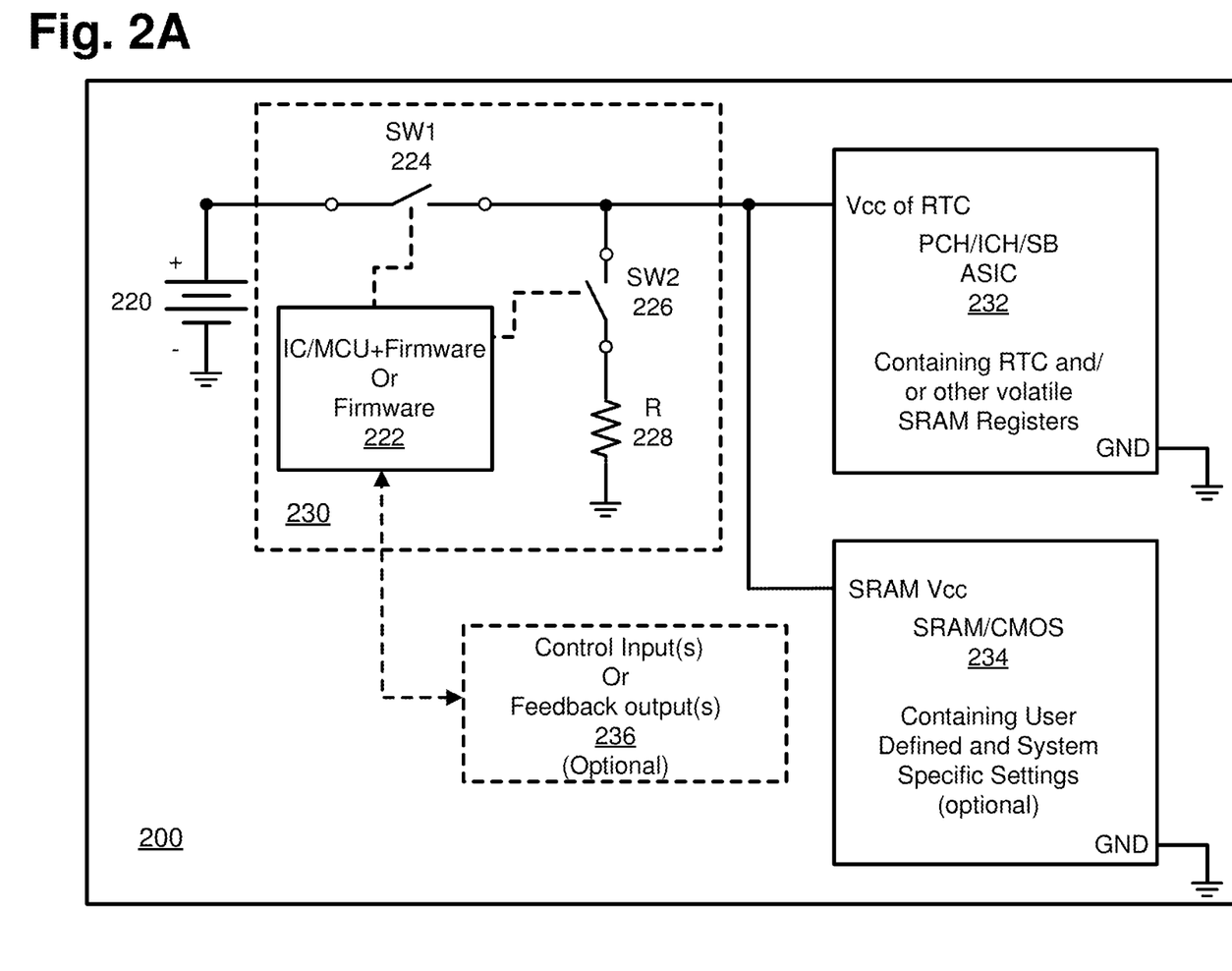
FIG. 2A illustrates a schematic diagram of an automated boot failure prevention and recovery circuit having a memory clearing function, in accordance with to an exemplary implementation of the present application.

Referring to FIG. 2A, FIG. 2A illustrates a schematic diagram of an automated boot failure prevention and recovery circuit having a memory clearing function, in accordance with to an exemplary implementation of the present application. As illustrated in FIG. 2A, diagram 200 includes power source 220, automated boot failure prevention and recovery circuit 230 (hereinafter "circuit 230"), platform controller hub (PCH), I/O controller hub (ICH), or Southbridge (SB) application specific integrated circuit (ASIC) 232 (hereinafter "ASIC 232"), and SRAM ICs or chip 234 (hereinafter "SRAM 234").

In the present implementation, power source 220 is a battery. In one implementation, power source 220 is a lithium coin cell battery. In one implementation, power source 220 is a power source outputting 3 Volts and 220 mAh. Power source 220 is configured to supply power to ASIC 232 and SRAM 234, subject to the operations of circuit 230.

ASIC 232 includes an RTC. ASIC 232 may also include other volatile SRAM registers. The power bus $V_{CC}$ of the RTC is selectively coupled to power source 220 subject to the operations of circuit 230.

SRAM 234 includes a plurality of SRAM memory cells, such as SRAM memory cell 100 shown in FIG. 1, arranged in one or more matrices along a plurality of word lines and a plurality of bit line pairs. SRAM 234 may store system settings (e.g., BIOS settings). SRAM 234 may also store other user defined and system specific settings. The power bus $V_{CC}$ of the SRAM memory cells is selectively coupled to power source 220 subject to the operations of circuit 230.

In the present implementation, circuit 230 includes IC or microcontroller 222 (hereinafter "microcontroller 222"), switch 224 (SW1), switch 226 (SW2), and resistor 228. In one implementation, microcontroller 222 may include one or more non-transitory media and at least one processor coupled to the one or more non-transitory media, where the one or more non-transitory media include one or more instructions (e.g., firmware) stored therein. The at least one processor may execute the one or more instructions stored in the one or more non-transitory media to selectively open and close switches 224 and 226. In another implementation, microcontroller 222 may include a state machine logic circuit to selectively open and close switches 224 and 226. Microcontroller 222 controls switch 224 to selectively disconnect ASIC 232 and SRAM 234 from power source 220. Microcontroller 222 also controls switch 226 to selectively provide a ground path to ASIC 232 and SRAM 234 through resistor 228.

As shown in in FIG. 2A, diagram 200 also optionally includes control input(s) or feedback output(s) circuit 236 which provides control input(s) and/or feedback output(s) to microcontroller 222.

Figure 2B:
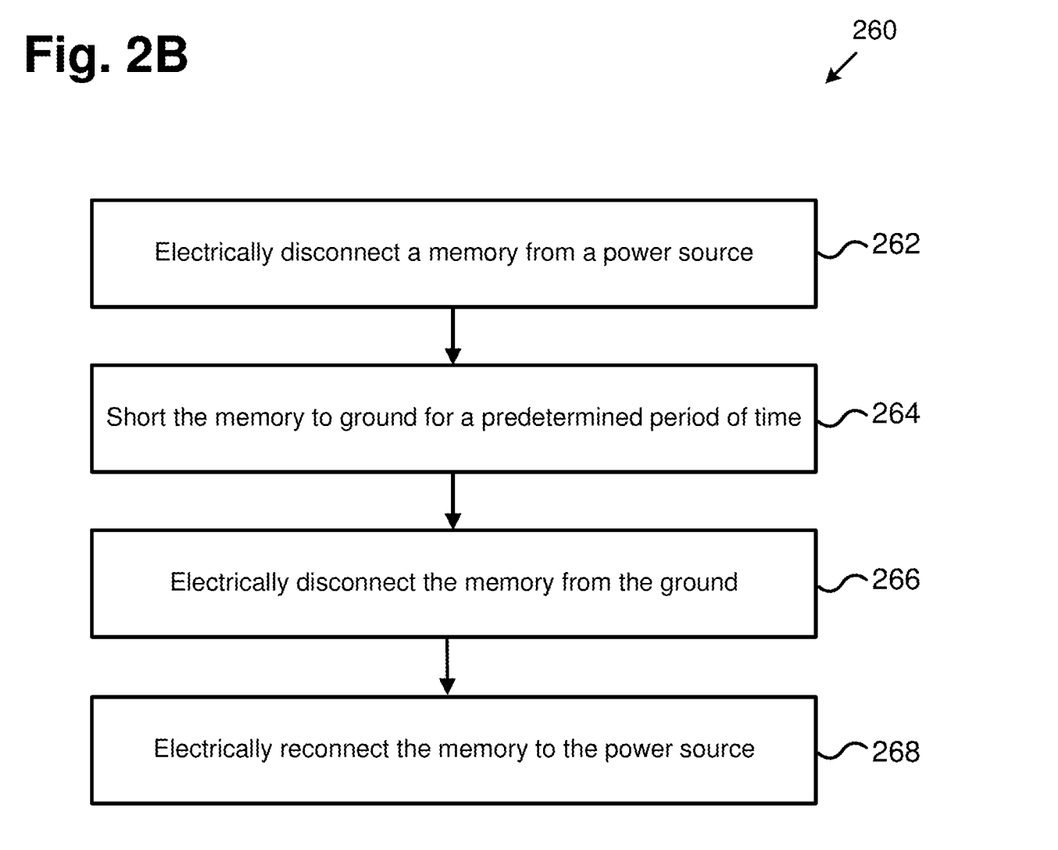
FIG. 2B is a flow diagram illustrating a memory clearing method, in accordance with to an exemplary implementation of the present application.

Referring now to FIG. 2B, FIG. 2B is a flow diagram illustrating a memory clearing method, in accordance with to an exemplary implementation of the present application. As shown in FIG. 2B, in the present exemplary implementation, flowchart 260 includes actions 262, 264, 266, and 268. In one implementation, flowchart 260 describes the operations of circuit 230 in FIG. 2A.

In action 262, circuit 230 electrically disconnects ASIC 232 and SRAM 234 from power source 220. In one implementation, microcontroller 222 may output a signal to switch 224 to electrically disconnect ASIC 232 and SRAM 234 from power source 220, for example, by opening switch 224. It should be noted that in action 262, switch 226 is open such that resistor 228 is not electrically coupled to ASIC 232 or SRAM 234.

In action 264, circuit 230 electrically connects (i.e., shorts) ASIC 232 and SRAM 234 to the ground. In one implementation, microcontroller 222 may output a signal to switch 226 to electrically couple ASIC 232 and SRAM 234 to the ground through resistor 228, for example, by closing switch 226. It should be noted that in action 264, while switch 226 is closed, switch 224 is open such that ASIC 232 and SRAM 234 are not electrically coupled to power source 220.

In one implementation, microcontroller 222 may control switch 226 to remain closed for a predetermined amount of time to allow the electrons in the SRAM memory cells to drain to the ground at the power bus $V_{CC}$. In one implementation, the predetermined amount of time for switch 226 to remain closed is about 30 seconds. In other implementations, the predetermined amount of time for switch 226 to remain closed may be less or greater than 30 seconds.

In action 266, circuit 230 electrically disconnects ASIC 232 and SRAM 234 from the ground. In one implementation, microcontroller 222 may output a signal to switch 226 to electrically disconnect ASIC 232 and SRAM 234 from the ground, for example, by opening switch 226. It should be noted that in action 266, switch 224 remains open such that ASIC 232 and SRAM 234 are not electrically coupled to power source 220.

In action 268, circuit 230 electrically reconnects ASIC 232 and SRAM 234 to power source 220. In one implementation, microcontroller 222 may output a signal to switch 224 to electrically reconnect ASIC 232 and SRAM 234 to power source 220, for example, by closing switch 224.

As a result of opening switch 224 and subsequently closing switch 226, the power bus $V_{CC}$ coupled to the SRAM memory cells in SRAM 234 is grounded. By grounding power bus $V_{CC}$, the electrons in the SRAM memory cells are drained. Thus, even when portions of SRAM memory cells in SRAM 234 are corrupt, the memory clearing method as described in flowchart 260 can help the corrupt SRAM memory cells recover by resetting them to a non-random or quiescent state.

In contrast to conventional CMOS clearing methods that require a system to be fully functional to write "0"s or "1"s to all the memory cells, the memory clearing method as described in FIG. 2B can recover from a boot failure or no-boot when the SRAM of an electronic device (e.g., server/motherboard) is already corrupted to a point where it cannot boot up at all and is non-responsive as a result (e.g., incapable of writing "0"s or "1"s).

In addition, by opening switch 224 and subsequently closing switch 226, the power bus $V_{CC}$ coupled to the RTC of ASIC 232 is grounded. By grounding the power bus $V_{CC}$ of the RTC, the memory clearing method shown in flowchart 260 may eliminate RTC latch-up and clear any corrupt internal registers within ASIC 232.

As a result of clearing SRAM 234, when the system attempts to boot up, the system cannot retrieve the Factory Default settings and/or User's Settings since SRAM 234 is in a completely blank state, the system may rewrite the Factory Default settings and/or User's Settings into SRAM 234. For example, detecting SRAM 234 being in the blank state may be performed by a HUB, a PCH, or a peripheral controller which then rewrites the Factory Default settings back into SRAM 234.

Figure 3A:
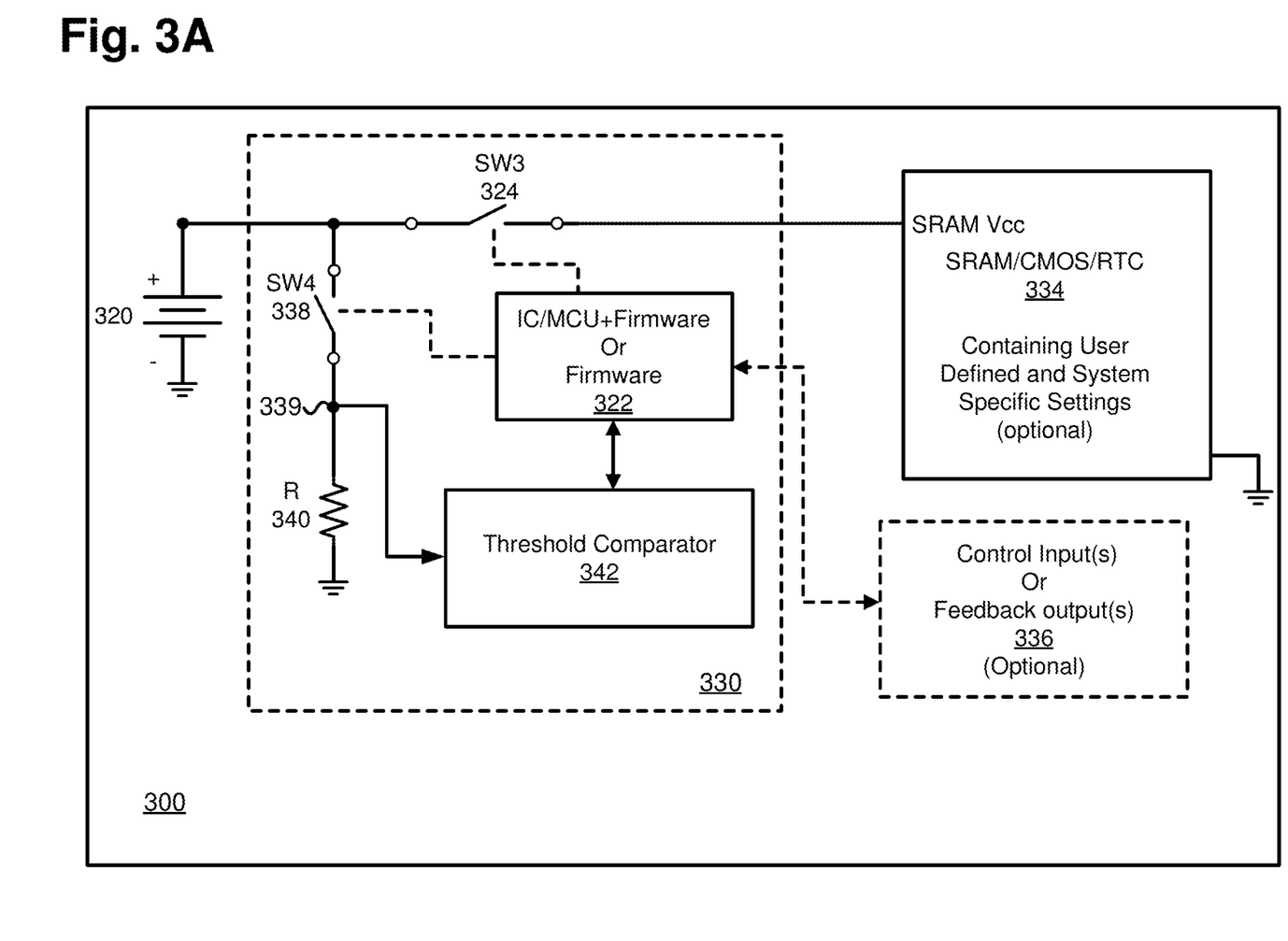
FIG. 3A illustrates a schematic diagram of an automated boot failure prevention and recovery circuit having a battery checking function, in accordance with to an exemplary implementation of the present application.

Referring to FIG. 3A, FIG. 3A illustrates a schematic diagram of an automated boot failure prevention and recovery circuit having a battery checking function, in accordance with to an exemplary implementation of the present application. As illustrated in FIG. 3A, diagram 300 includes power source 320, automated boot failure prevention and recovery circuit 330 (hereinafter "circuit 330"), and SRAM ICs or chip 334 (hereinafter "SRAM 334"). In one implementation, SRAM 334 may be coupled to one or more platform controller hub (PCH), I/O controller hub (ICH), or Southbridge (SB) application specific integrated circuits (ASICs) (not explicitly shown in FIG. 3A) in parallel.

In the present implementation, power source 320 is a battery. In one implementation, power source 320 is a lithium coin cell battery. In one implementation, power source 320 is a power source having initial outputs of 3 Volts and 220 mAh. Power source 220 is configured to supply power to SRAM 234, subject to the operations of circuit 330.

SRAM 334 includes a plurality of SRAM memory cells, such as SRAM memory cell 100 shown in FIG. 1, arranged in one or more matrices along a plurality of word lines and a plurality of bit line pairs. SRAM 334 may store system settings (e.g., BIOS settings). SRAM 334 may also store other user defined and system specific settings. The power bus $V_{CC}$ of the SRAM memory cells is selectively coupled to power source 320 subject to the operations of circuit 330.

In the present implementation, circuit 330 includes IC or microcontroller 322 (hereinafter "microcontroller 322"), switch 324 (SW3), switch 338 (SW4), resistor 340, and threshold comparator 342. In one implementation, microcontroller 322 may include one or more non-transitory media and at least one processor coupled to the one or more non-transitory media, where the one or more non-transitory media include one or more instructions (e.g., firmware) stored therein. The at least one processor may execute the one or more instructions stored in the one or more non-transitory media to selectively open and close switches 324 and 338. In another implementation, microcontroller 322 may include a state machine logic circuit to selectively open and close switches 324 and 338. Microcontroller 322 controls switch 324 to selectively disconnect SRAM 334 from power source 320. Microcontroller 322 also controls switch 338 to selectively apply a load (e.g., resistor 340) to power source 320 for checking the battery information (e.g., type, voltage, state, age, and etc.) of power source 320.

In the present implementation, threshold comparator 342 may receive a measured voltage across resistor 340 and a threshold voltage, and output a signal representing the comparison result to microcontroller 322. In one implementation, threshold comparator 342 may be an analog comparator. In one implementation, threshold comparator 342 may be a digital comparator.

As shown in in FIG. 3A, diagram 300 also optionally includes control input(s) or feedback output(s) circuit 336 which provides control input(s) and/or feedback output(s) to microcontroller 322.

Figure 3B:
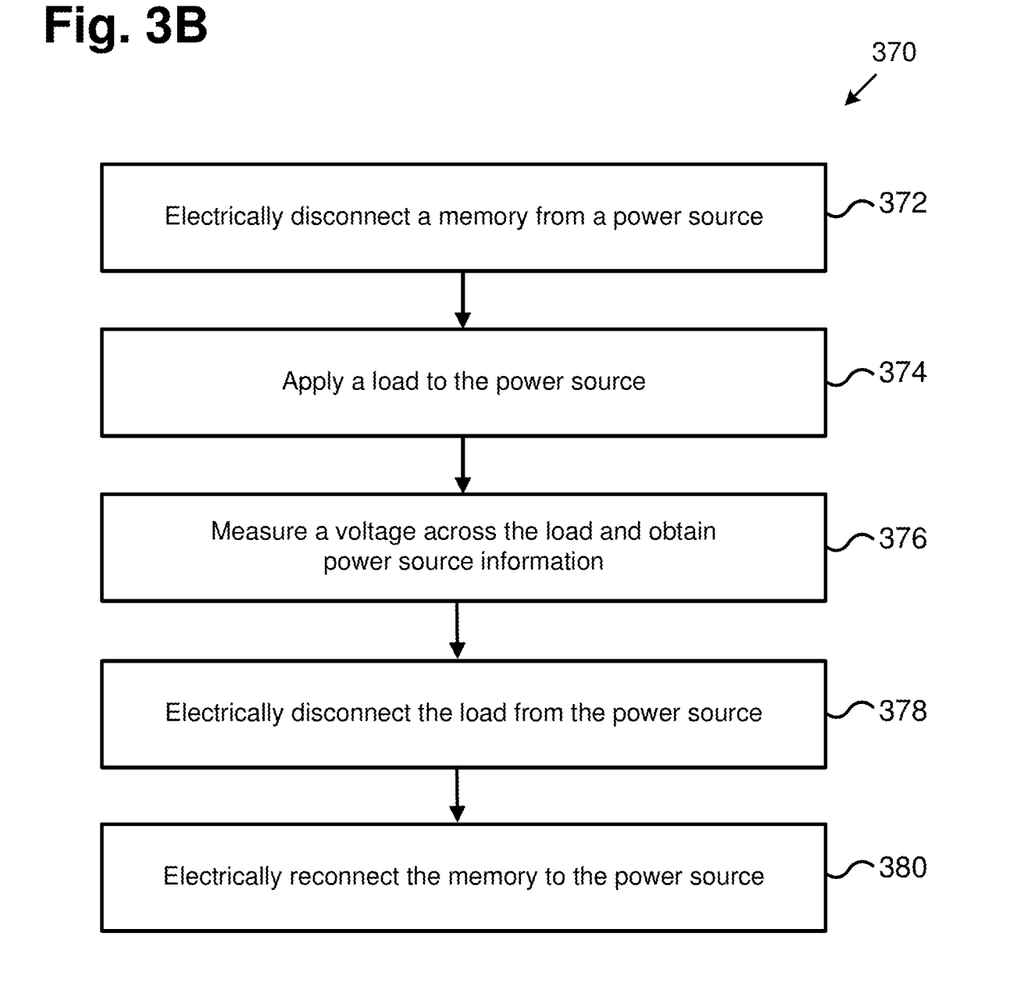
FIG. 3B is a flow diagram illustrating a battery checking method, in accordance with to an exemplary implementation of the present application.

Referring now to FIG. 3B, FIG. 3B is a flow diagram illustrating a battery checking method, in accordance with to an exemplary implementation of the present application. As shown in FIG. 3B, in the present exemplary implementation, flowchart 370 includes actions 372, 374, 376, 378, and 380. In one implementation, flowchart 370 describes the operations of circuit 330 in FIG. 3A.

In action 372, circuit 330 electrically disconnects SRAM 334 from power source 320. In one implementation, microcontroller 322 may output a signal to switch 324 to electrically disconnect SRAM 334 from power source 320, for example, by opening switch 324. It should be noted that in action 372, switch 338 is open such that resistor 340 is not electrically coupled to power source 320.

In action 374, circuit 330 electrically applies a load to power source 320. In one implementation, microcontroller 322 may output a signal to switch 338 to electrically connect power source 320 to resistor 340, for example, by closing switch 338. It should be noted that in action 374, while switch 338 is closed, switch 324 is open such that SRAM 334 is not electrically coupled to power source 320.

In action 376, circuit 330 is configured to measure a voltage across the load and obtain/acquire the power source information (e.g., battery state) of power source 320. In the present exemplary implementation, since power source 320 and resistor 340 are both coupled to the ground, microcontroller 322 can measure the voltage at node 339 between switch 338 and resistor 340 with respect to the ground to obtain/acquire the power source information of power source 320.

In one implementation, the measured voltage across power source 320 may be sent to threshold comparator 342, where the measure voltage is compared to a threshold voltage in either analog or digital domain. If the measure voltage across power source 320 is less than the threshold voltage, threshold comparator 342 may output a signal to microcontroller 322 to prompt the user to change replace power source 320. As such, circuit 330 can monitor and notify the user or system of the battery charge status to preclude loss of SRAM data. In one implementation, the threshold voltage is 2.7 Volts. In another implementation, the threshold voltage may be greater or less than 2.7 Volts.

In action 378, circuit 330 electrically disconnects power source 320 from the load. In one implementation, microcontroller 322 may output a signal to switch 338 to electrically disconnect power source 320 from resistor 340, for example, by opening switch 338. It should be noted that in action 378, switch 324 remains open such that SRAM 334 is not electrically coupled to power source 320.

In action 380, circuit 330 electrically reconnects SRAM 334 to power source 320. In one implementation, microcontroller 322 may output a signal to switch 324 to electrically couple SRAM 334 to power source 320, for example, by closing switch 324.

In one implementation, the battery checking method described with reference to flowchart 370 and circuit 330 may be performed periodically to constantly monitor the battery state to prevent boot failure.

Figure 4A:
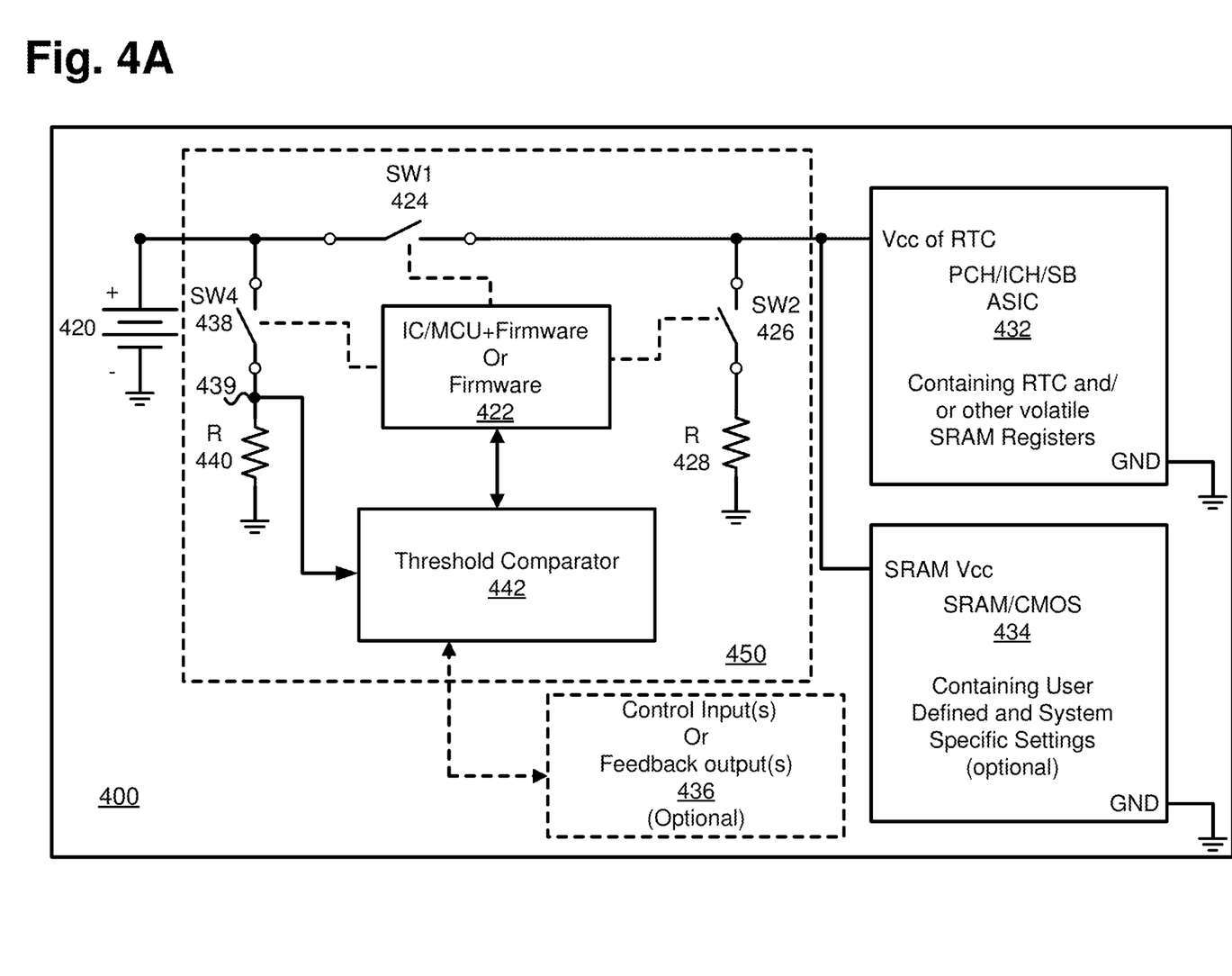
FIG. 4A illustrates a schematic diagram of an automated boot failure prevention and recovery circuit having a memory clearing function and a battery checking function, in accordance with to an exemplary implementation of the present application.

Referring to FIG. 4A, FIG. 4A illustrates a schematic diagram of an automated boot failure prevention and recovery circuit having a memory clearing function and a battery checking function, in accordance with to an exemplary implementation of the present application. As illustrated in FIG. 4A, diagram 400 includes power source 420, automated boot failure prevention and recovery circuit 450 (hereinafter "circuit 450"), platform controller hub (PCH), I/O controller hub (ICH), or Southbridge (SB) application specific integrated circuit (ASIC) 432 (hereinafter "ASIC 432"), and SRAM ICs or chip 434 (hereinafter "SRAM 434").

In the present implementation, power source 420 is a battery. In one implementation, power source 420 is a lithium coin cell battery. In one implementation, power source 420 is a power source outputting 3 Volts and 220 mAh. Power source 420 is configured to supply power to ASIC 432 and SRAM 434, subject to the operations of circuit 450.

ASIC 432 and SRAM 434 are substantially similar to ASIC 232 and SRAM 234, respectively, in FIG. 2A. The power bus $V_{CC}$ of the RTC is selectively coupled to power source 420 subject to the operations of circuit 450. Also, the power bus $V_{CC}$ of the SRAM memory cells is selectively coupled to power source 420 subject to the operations of circuit 450.

In the present implementation, circuit 450 includes microcontroller 422, switch 424 (SW1), switch 426 (SW2), switch 438 (SW4), resistor 428, resistor 440, and threshold comparator 442.

In one implementation, microcontroller 422 may include one or more non-transitory media and at least one processor coupled to the one or more non-transitory media, where the one or more non-transitory media include one or more instructions (e.g., firmware) stored therein. The at least one processor may execute the one or more instructions stored in the one or more non-transitory media to selectively open and close switches 424, 426 and 438. In another implementation, microcontroller 422 may include a state machine logic circuit to selectively open and close switches 424, 426 and 438. Microcontroller 422 controls switch 424 to selectively disconnect ASIC 432 and SRAM 434 from power source 420. Microcontroller 422 controls switch 426 to selectively provide a ground path to ASIC 432 and SRAM 434 through resistor 428. Microcontroller 422 also controls switch 438 to selectively apply a load (e.g., resistor 440) to power source 420 for checking the battery information (e.g., type, voltage, state, age, and etc.) of power source 420.

In the present implementation, threshold comparator 442 may receive a measured voltage across resistor 440 and a threshold voltage, and output a signal representing the comparison result to microcontroller 422. In one implementation, threshold comparator 442 may be an analog comparator. In one implementation, threshold comparator 442 may be a digital comparator.

As shown in in FIG. 4A, diagram 400 also optionally includes control input(s) or feedback output(s) circuit 436 which provides control input(s) and/or feedback output(s) to microcontroller 422.

Figure 4B:
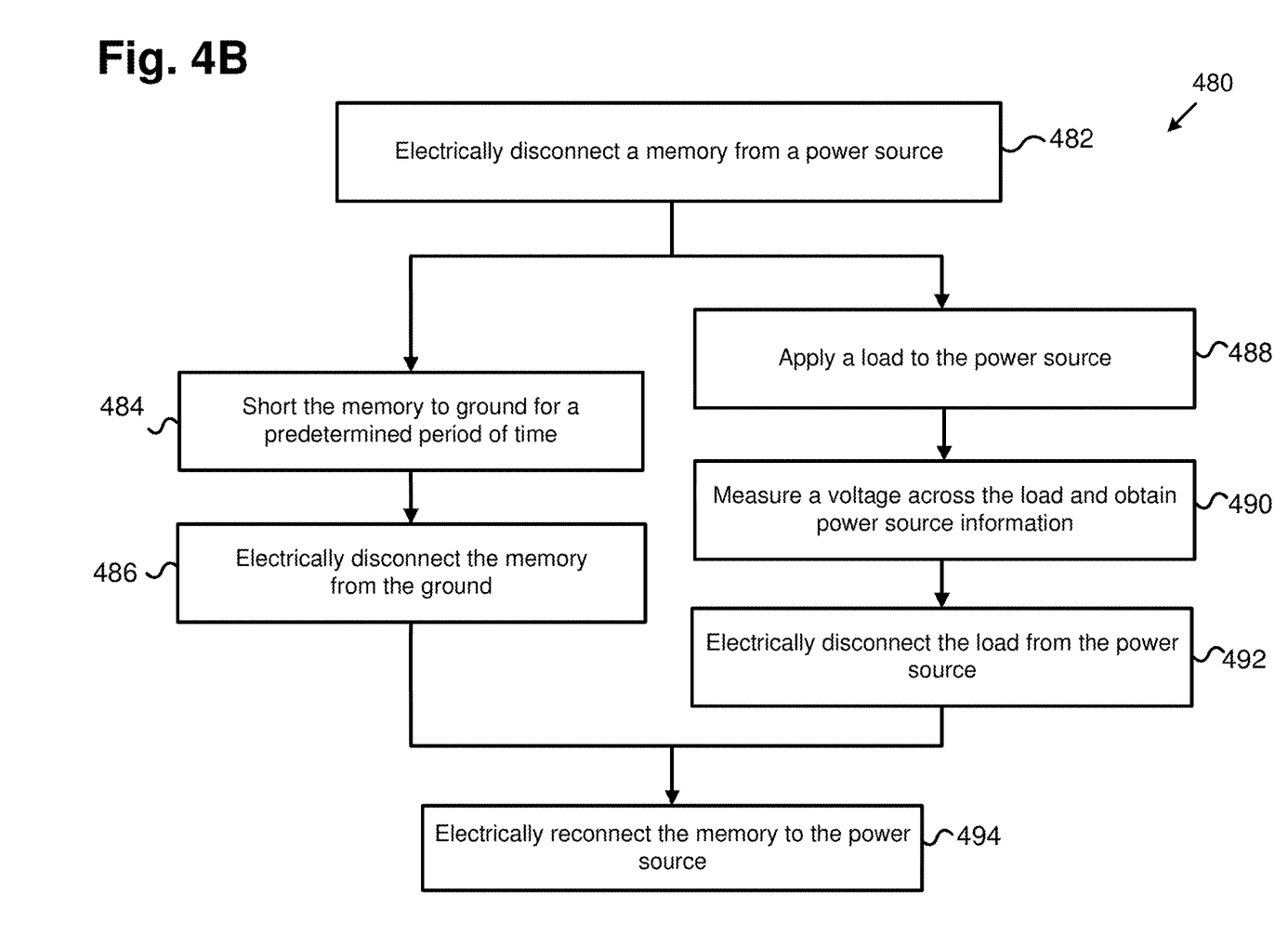
FIG. 4B is a flow diagram illustrating a method of clearing a memory and checking battery information, in accordance with to an exemplary implementation of the present application.

Referring now to FIG. 4B, FIG. 4B is a flow diagram illustrating a method of clearing a memory and checking a battery information in accordance with to an exemplary implementation of the present application. As shown in FIG. 4B, in the present exemplary implementation, flowchart 480 includes actions 482, 484, 468, 488, 490, 492, and 494. In one implementation, flowchart 480 describes the operations of circuit 450 in FIG. 4A. The operations of circuit 450 will be explained with reference to FIG. 4B.

In action 482, circuit 450 electrically disconnects ASIC 432 and SRAM 434 from power source 420. In one implementation, microcontroller 422 may output a signal to switch 424 to electrically disconnect ASIC 432 and SRAM 434 from power source 420, for example, by opening switch 424. It should be noted that in action 482, switch 438 is open such that resistor 440 is not electrically coupled to power source 420. Also, in action 482, switch 426 is open such that resistor 428 is not electrically coupled to ASIC 432 or SRAM 434.

In action 484, circuit 450 electrically connects (i.e., shorts) ASIC 432 and SRAM 434 to the ground. In one implementation, microcontroller 422 may output a signal to switch 426 to electrically couple ASIC 432 and SRAM 434 to the ground through resistor 428, for example, by closing switch 426. It should be noted that in action 484, while switch 426 is closed, switch 424 is open such that ASIC 432 and SRAM 434 are not electrically coupled to power source 420.

In one implementation, microcontroller 422 may control switch 426 to remain closed for a predetermined amount of time to allow the electrons in the SRAM memory cells to drain to the ground at the power bus $V_{CC}$. In one implementation, the predetermined amount of time for switch 426 to remain closed is about 30 seconds. In other implementations, the predetermined amount of time for switch 426 to remain closed may be less or greater than 30 seconds.

In action 486, circuit 450 electrically disconnects ASIC 432 and SRAM 434 from the ground. In one implementation, microcontroller 422 may output a signal to switch 426 to electrically disconnect ASIC 432 and SRAM 434 from the ground, for example, by opening switch 426. It should be noted that in action 486, switch 424 remains open such that ASIC 432 and SRAM 434 are not electrically coupled to power source 420.

In action 488, circuit 450 electrically applies a load to power source 420. In one implementation, microcontroller 422 may output a signal to switch 438 to electrically connect power source 420 to resistor 440, for example, by closing switch 438. It should be noted that in action 488, while switch 438 is closed, switch 424 is open such that ASIC 432 and SRAM 434 are not electrically coupled to power source 420 or resistor 440.

In action 490, circuit 450 is configured to measure a voltage across the load and obtain/acquire power source information (e.g., battery state) of power source 420. In the present exemplary implementation, since power source 420 and resistor 440 are both coupled to the ground, microcontroller 422 can measure the voltage at node 439 between switch 438 and resistor 440 with respect to the ground to obtain/acquire the power source information of power source 420.

In one implementation, the measured voltage across power source 420 may be sent to threshold comparator 442, where the measure voltage is compared to a threshold voltage in either analog or digital domain. If the measure voltage across power source 420 is less than the threshold voltage, threshold comparator 342 may output a signal to microcontroller 422 to prompt the user to change replace power source 420. As such, circuit 450 can monitor and notify the user or system of the battery charge status to preclude loss of SRAM data. In one implementation, the threshold voltage is 2.7 Volts. In another implementation, the threshold voltage may be greater or less than 2.7 Volts.

In action 492, circuit 450 electrically disconnects power source 420 from the load. In one implementation, microcontroller 422 may output a signal to switch 438 to electrically disconnect power source 420 from resistor 440, for example, by opening switch 438. It should be noted that in action 492, switch 424 remains open such that ASIC 432 and SRAM 434 are not electrically coupled to power source 420.

In action 494, circuit 450 electrically reconnects ASIC 432 and SRAM 434 to power source 420. In one implementation, microcontroller 422 may output a signal to switch 424 to electrically reconnect ASIC 432 and SRAM 434 to power source 420, for example, by closing switch 424. It should be noted that in action 494, switches 426 and 438 remain open such that ASIC 432 and SRAM 434 are not electrically coupled to the ground, and that power source 420 is not coupled to resistor 440.

With respect to actions 482, 484, 486, and 486, as a result of opening switch 424 and subsequently closing switch 426, the power bus $V_{CC}$ coupled to the SRAM memory cells in SRAM 434 is grounded. By grounding power bus $V_{CC}$, the electrons in the SRAM memory cells are drained. Thus, even when portions of SRAM memory cells in SRAM 434 are corrupt, the memory clearing method as described in flowchart 480 can help the corrupt SRAM memory cells recover by resetting them to a non-random or quiescent state.

In contrast to conventional CMOS clearing methods that require a system to be fully functional to write "0"s or "1"s to all the memory cells, the memory clearing method as described in FIG. 4B can recover from a boot failure or no-boot when the SRAM of an electronic device server/motherboard) is already corrupted to a point where it cannot boot up at all and is non-responsive as a result (e.g., incapable of writing "0"s or "1"s).

In addition, by opening switch 424 and subsequently closing switch 426, the power bus $V_{CC}$ coupled to the RTC of ASIC 432 is grounded. By grounding the power bus $V_{CC}$ of the RTC, the memory clearing method shown in flowchart 480 may eliminate RTC latch-up and clear any corrupt internal registers within ASIC 432.

As a result of clearing SRAM 434, when the system attempts to boot up, the system cannot retrieve the Factory Default settings and/or User's Settings since SRAM 434 is in a completely blank state, the system may rewrite the Factory Default settings and/or User's Settings into SRAM 434. For example, detecting SRAM 434 being in the blank state may be performed by a HUB, a PCH, or a peripheral controller which then rewrites the Factory Default settings back into SRAM 434.

With respect to actions 482, 488, 490, and 492 of flowchart 480, the battery checking function described with reference to circuit 450 may be performed periodically to constantly monitor the battery state to prevent boot failure.

It should be noted that circuit 450 may perform the memory clearing function and the battery checking function independent of each other, while switch 424 is open.

Figure 5:
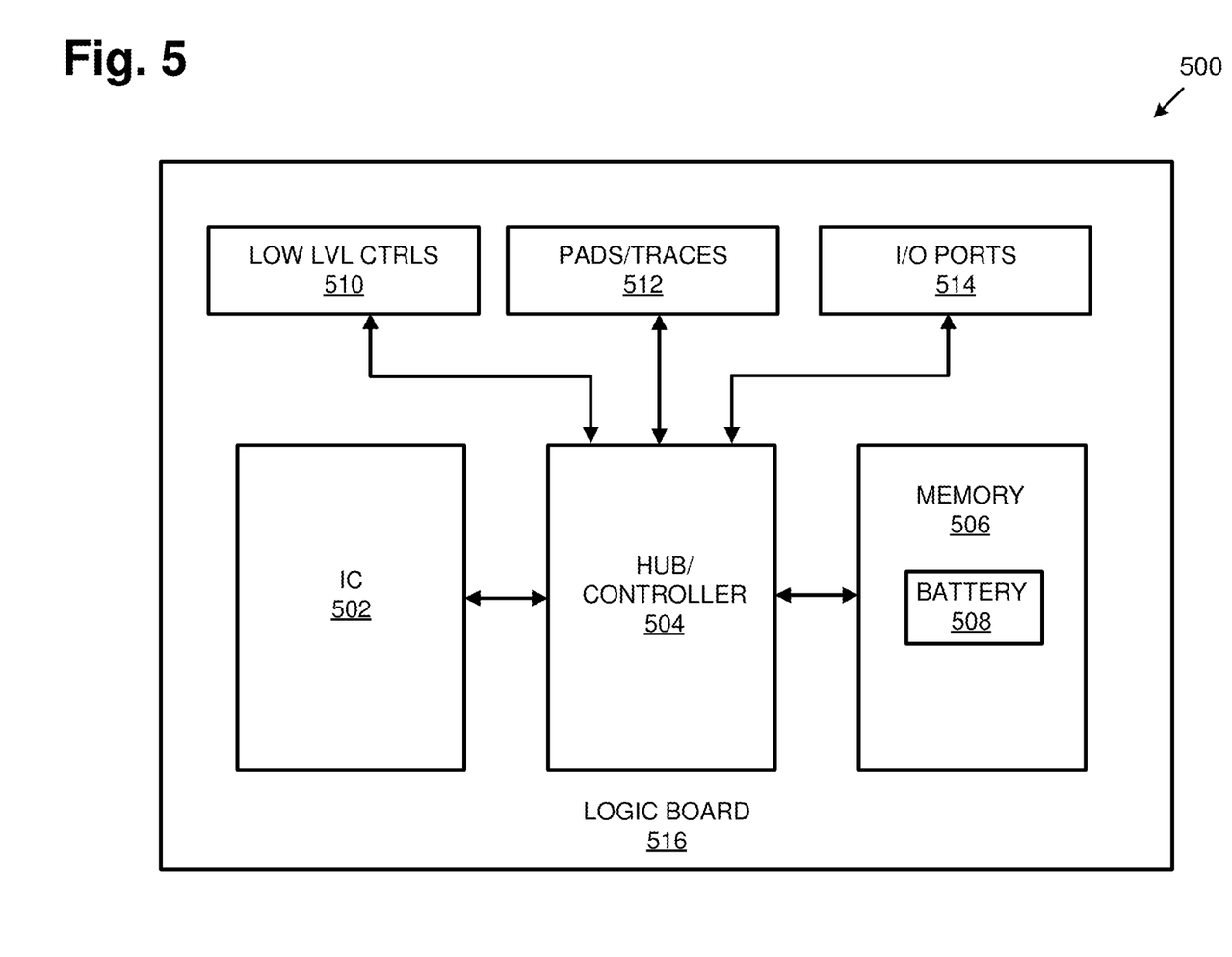
FIG. 5 is a schematic view showing an environment of an electronic device having an automated boot failure prevention and recovery circuit, in accordance with to an exemplary implementation of the present application.

Referring now to FIG. 5, FIG. 5 is a schematic view showing an environment of an electronic device having an automated boot failure prevention and recovery circuit, in accordance with to an exemplary implementation of the present application.

In FIG. 5, electronic device 500 may include integrated circuit (IC) 502, controller/hub 504, memory 506, battery 508, low-level controls 510, low-level controls 510, pads or traces 512 (hereinafter "electrical connections 512"), I/O ports 514, and logic board 516.

IC 502 may include at least one or more electrical connections and at least one or more generic input and/or output connection. IC 502 may contain, for example, system firmware (e.g., BIOS), firmware, memory (e.g., ROM or RAM), storage (e.g., EEPROM), etc., for measuring data, storing data, and/or programming or reprogramming the IC. Additionally, IC 502 may contain various devices and/or circuitry for processing (e.g., receiving, measuring, and converting) signals to data (and vice versa), for example, IC 502 may contain A/D and/or D/A conversion circuitry or may connect to another component, for example, a comparator for such processing.

IC 502 may be communicatively coupled to logic board 516 through electrical connections 512, and/or specifically through a bus or any form of intra-board communication. Logic board 516 may be a printed circuit board, a motherboard, a main logic board (MLB) or the like, having a plurality of electrical or optical connections for input and output devices, firmware, sensors, I/O ports, storage, memory, and various other components and hardware. Additionally, logic board 516 may include, for example, system firmware (e.g., BIOS), firmware, memory (e.g., ROM or RAM), storage (e.g., EEPROM), and various devices and/or circuitry for processing (e.g., receiving, measuring, converting, and transmitting) signals to data (and vice versa). As will further be described in detail, electronic device 500 may be a computer, server, tablet, portable device, or mobile system comprising a plurality of on-board devices and peripheral connections with various interfaces for communicating with IC 502. Correspondingly, the use of IC 502 in this disclosure is meant to apply broadly and to refer to all semiconductor fabricated circuitry and devices to provide more functionality or better operability with various systems and configuration which logic board 516 may take.

Logic board 516 may further comprise management controller and/or management software or firmware such as embedded memory or any of the aforementioned memory or storage systems for remotely or locally connecting to and managing electronic device 500 by, for example, lights out management (LOM) technology or an integrated lights-out (iLO) technology, which allows a user to log into electronic device 500 and configure or control software or hardware settings.

In the exemplary implementation of FIG. 5, controller/hub 504 may be in electrical communication with IC 502, memory 506, battery 508, I/O ports 514, low-level controls 510, and electrical connections 512 of logic board 516. Various other connections and configurations may be implemented to accomplish the task at hand. For example, IC 502 may be customized or selectively configured to utilize other components and connections in logic board 516 to recover from a system error or non-boot related to other unforeseen factors or conditions not described in detail herein (e.g., failure due to temperature sensitivity or electrostatic discharge). It is left to the designer as to the properties and design of the chip and board layout to provide a robust system for handling various system or hardware related errors.

IC 502 may be connected to controller/hub 504 either directly through electrical connections 512, by way of the system CPLD or system firmware (e.g., BIOS), or remotely or locally connected to by accessing, for example, lights out management (LOM) technology or an integrated lights-out (iLO) technology of logic board 516. Moreover, controller/hub 504 may be a peripheral interface device, a memory controller hub (MCH), or an I/O Controller Hub (ICH), and need not be limited to a certain type of controller hub. Controller/hub 504 constitutes the core logic chipset of the motherboard of electronic device 500 comprising a set of microchips or a system on a chip (SOC) design with certain data paths and support functions to manage data communications between a CPU and a motherboard. Controller/hub 504 may be a single hub or a plurality of hubs paired together, which, may include a support chipset, to connect and control peripheral devices. The controller/hub 504 may execute various functions including clocking (e.g., system clock), providing data interfaces (Flexible Data Interface (FDI), Direct Media Interface (DMI), etc.), I/O functions, graphics (PCI/PCI-e) lanes, SATA, USB, and HDA lines, and SPI/I$^2$C/UART/GPIO lines, and DisplayPort, RAM, and SMBus lines. IC 502 may conceivably be connected through any of the lanes, lines, or interfaces provided by or to controller/hub 504.

Furthermore, controller/hub 504 comprises a Real-Time Clock (RTC) for keeping track of the current time using, for example, a crystal oscillator or power line frequency to keep accurate time. The RTC may have an alternate source of power, such as, battery 508 (e.g., lithium battery or supercapacitor), to keep time while the primary source of power to controller/hub 504 or electronic device 500 is off or unavailable. Moreover, controller/hub 504 comprises internal registers, firmware, memory (e.g., ROM or RAM), storage (e.g., EEPROM), and various devices and/or circuitry for processing (e.g., receiving, measuring, converting, and transmitting) signals to data (and vice versa). In particular, controller/hub 504 may contain memory and/or internal registers (e.g., RAM or ROM) for processing system data and executing various functions.

IC 502 may be communicatively coupled to controller/hub 504 by any systems of intra-board communication to ascertain or modify the state of controller/hub 504, for example, by processing (e.g., receiving, measuring, converting, and transmitting) signals or data to aid in recovery of system failure or a non-boot system. Moreover, IC 502 may communicate with controller/hub 504 to directly or indirectly clear registers, memory, as well as to reset the real-time clock (RTC) of controller/hub 504. For example, IC 502 may directly reset the RTC by communicating or asserting a reset function to controller/hub 504 for resetting the RTC. IC 502 may indirectly reset the RTC by way of disconnecting a source of voltage to the RTC (e.g., a memory voltage, SRAM Vcc). IC 502 may also access other registers associated with a reset signal to perform a RTC reset.

IC 502 may be communicatively coupled to battery 508 directly through controller/hub 504, electrical connections 512, and/or through the system CPLD, the system firmware (e.g., BIOS), or management controller and/or management software or firmware (e.g., iLO or LOM) of electronic device 500. Battery 508 provides power for system memory (e.g., volatile or nonvolatile BIOS memory) or any small memory on the MLB or PCB, used for example, to store system firmware (e.g., BIOS) settings of electronic device 500. Generally, battery 508 supplies low power to system memory (e.g., as a battery backed RAM) when electronic device 500 is off (e.g., system and standby power are off) and keeps the RTC running while the primary source of power to the controller/hub 504 or electronic device 500 is off or unavailable. Battery 508 may take any suitable form and voltage. In certain exemplary implementations, battery 508 may be a lithium coin cell with a voltage of 3.0V. Battery 508 may however be any other fixed, removable, disposable, and/or rechargeable type (e.g., a supercapacitor, nickel-cadmium (NiCad), or nickel-metal hydride (NiMH)). Battery 508 may also be a non-button cell battery such as a cylindrical "½ AA". IC 502 obtains/acquires battery information in real-time such as type, voltage, state, age, etc. IC 502 may further store logs of such battery information for a user to monitor the state and condition of battery 508.

Furthermore, IC 502 may be electrically coupled to battery 508 through electrical connections 512 to momentarily isolate battery 508 from the remaining circuitry to perform an A-to-D measurement or connect to a comparator to ascertain the voltage state of battery 508. IC 502 temporarily disconnects battery 508 from memory 506 to measure the voltage, test the condition, and verify the presence of battery 508 in real-time. This measurement may or may not involve a load resistance. Once the measurement is complete and battery information is ascertained, battery 508 is reconnected to memory 506 to continue its data backup function.

IC 502 may be communicatively coupled to the memory 506 of logic board 516 directly or indirectly through electrical connections 512, and/or through the system CPLD, or management controller and/or management software or firmware (e.g., iLO or LOM) of electronic device 500. Moreover, IC 502 may also be communicatively coupled to the memory 506 through a bus or any systems of intra-board communication. IC 502 may, either directly or indirectly, access, ascertain or modify the state, or process (e.g., receiving, measuring, converting, and transmitting) signals or data (or vice versa) memory 506 to aid in recovery of system failure or a non-boot system.

As with battery 508, IC 502 may be configured to selectively provide one or more electrical signal flow paths to or from memory 506 of electronic device 500, for example, through electrical connections 512, a bus, or any systems of intra-board communication. In another exemplary implementation, IC 502 may be configured to communicate an electrical signal to low level controls/commands, such as but limited to, connecting/disconnecting (e.g., power on/off) of memory 506 from electronic device 500. Indeed, IC 502 may function to re-route power to and from memory 506 and battery 508 as well as other components of electronic device 500 to aid in recovery of system failure or a non-boot system.

Moreover, IC 502 may momentarily disconnect and/or reconnect battery 508 and/or memory 506 in real-time, either simultaneously or in any order, to thereby directly or indirectly, access, ascertain or modify the state, or process (e.g., receiving, measuring, converting, and transmitting) signals or data (or vice versa) to aid in recovery of system failure or a non-boot system. Additionally, IC 502 may provide primary power to avoid loss of system time and BIOS settings (e.g., BIOS settings) when battery 508 and/or memory 506 (e.g., SRAM) is disconnected from electronic device 500. Also, IC 502 may be configured to store the system firmware (e.g., BIOS) or peripheral interface device (e.g., RBSU settings) to avoid loss of data when battery 508 and/or memory 506 is replaced, reinstalled, disconnected and/or subsequently reconnected.

Memory 506 may comprise a volatile or nonvolatile system firmware (e.g., BIOS) memory, or any small memory on motherboards, used for example, to store system firmware (e.g., BIOS) settings. Memory 506 may be a volatile, low-power CMOS SRAM powered by a battery 508 when system and standby power are off. Additionally, memory 506 and real-time clock of electronic device 500 may or may not be integrated. Furthermore, electronic device 500 may comprise embedded memory or any of the aforementioned memory or storage systems for remotely or locally managing memory 506 and battery 508 through IC 502 using management controller and/or management software or firmware, for example, lights out management (LOM) technology or an integrated lights-out (iLO) technology.

Furthermore, electronic device 500 may generally comprise a plurality of I/O ports 514 (e.g., PCI/PCIe, CAN, I$^2$C, LPC, UART, LVDS, PS/2, LPT, USB, DisplayPort, etc.). Additionally, I/O ports 514 may comprise an I/O module having a plurality of buttons and I/O ports (e.g., USB, HDMI, memory, etc.), as well as other memory modules (e.g., a Mini-SATA).

A user may connect to IC 502 either locally (e.g., through a laptop) or remotely (e.g., WiFi) from one or more I/O ports 514 to manage components of electronic device 500. Furthermore, separate from or in addition to connecting to IC 502 through one or more I/O ports 514, IC 502 may be connected to the components of electronic device 500 through any management system for remotely or locally connecting to and managing electronic device 500 by, for example, lights out management (LOM) technology or an integrated lights-out (iLO) technology. Thus, IC 502 may communicate with logic board 516 and the user through either I/O ports 514 or management technology, or any combination of the two.

IC 502 may connect to low level controls 510 of electronic device 500 through, for example, the system CPLD, to ascertain whether primary and/or auxiliary power is on/off, or whether the reset function of electronic device 500 has been asserted. Additionally, IC 502 may be in electrical communication with low level controls 510 to determine whether standby or auxiliary power is present, for example, whether the battery 508 has been removed, replaced, and/or installed. Thus, IC 502 may be communicatively coupled to low level controls 510 to access and verify the state of primary and/or auxiliary power, as well as the state of battery 508 (e.g., battery information). Low level controls 510 of the system can directly and/or indirectly provide the primary, auxiliary, and/or standby power status of the system when IC 502 is not directly connected to the various components of electronic device 500. Low level controls 510 may also serve as a redundant or fail-safe system of verifying the power status of the system.

In an exemplary implementation, low level controls 510 may serve to provide IC 502 and/or logic board 516 with primary and/or secondary power. Low level controls 510 may be integrated with a component of electronic device 500 (e.g., as a SOC) or integrated into electronic device 500 itself (e.g., as a component on the motherboard). In cases where a direct electrical connection cannot be made to power on/off or disconnect a component of electronic device 500, IC 502 may be coupled to low level controls 510 of electronic device 500 or the components of electronic device 500 to indirectly access to low level controls 510. Thus, IC 502 can disconnect components of electronic device 500, for example, the memory 506 or battery 508 for processing (e.g., receiving, measuring, testing, converting, and transmitting) signals to data (and vice versa).

In another exemplary implementation, IC 502 may be coupled to and powered by electrical connections 512 which may provide primary as well as auxiliary power. IC 502 may also be integrated into the standby power of logic board 516. Alternatively, IC 502 may also be integrated into any component of logic board 516 and receive power through, for example, a secondary, auxiliary, or standby power source.

According to implementations of the present application, a process for clearing a component (e.g., memory) in a server, computer, tablet, or portable device using an automated boot failure prevention and recovery circuit is presented. The automated boot failure prevention and recovery circuit (e.g., circuit 230 in FIG. 2A) may be a part of an integrated circuit (IC), such as IC 502 in FIG. 5. The process includes waiting until the system (e.g., electronic device) is either powered off, being powered off, or in the initial boot up sequence where altering the state of the memory in the system does not jeopardize the stability of the system or its components. Once the memory voltage supply line is off, the IC electrically disconnects the memory from the electronic device (e.g., from secondary, auxiliary, or standby power). The IC (then shorts or connects the memory to the ground (e.g., by grounding memory voltage supply line) for a predetermined period of time to clear invalid, randomized, or unusable data within the memory. In this process, it is further possible to clear controller hub internal registers and eliminate an RTC-latch up based on the user needs. The IC then removes the short or ground connection to the component of the electronic device (e.g., the memory), and electrically reconnects the component of the electronic device to standby or auxiliary power (e.g., battery).

According to implementations of the present application, a process for checking battery information (e.g., CMOS SRAM battery) in a server, computer, tablet, or portable device using an automated boot failure prevention and recovery circuit is presented. The automated boot failure prevention and recovery circuit (e.g., circuit 330 in FIG. 3A) may be a part of an integrated circuit (IC), such as IC 502 in FIG. 5. The process includes electrically disconnecting the battery from the system (e.g. electronic device) by, for example, cutting off the electrical connection to standby or auxiliary power (e.g., battery). The IC then acquires the state of the battery (e.g., by applying a load or resistance from a resistor) to generate a current or voltage response. The IC (e.g., microcontroller) then measures the voltage and/or current drawn from the battery including battery information (e.g., type, voltage, state, age, and etc.) which is then passed to the electronic device components or management controller and/or management software (e.g. LOM or iLO) and/or may be further stored within the IC for maintaining a health record of the system. Once the IC completes acquisition of battery information, the load may be removed from the battery. The IC then electrically reconnects the battery to the electronic device.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An automated boot failure prevention and recovery circuit, comprising:
   one or more non-transitory computer-readable media having computer-executable instructions embodied thereon;
   at least one processor coupled to the one or more non-transitory computer-readable media, and configured to execute the computer-executable instructions to:
   electrically disconnect a memory from a power source;
   short the memory to ground for a predetermined period of time while the memory is electrically disconnected from the power source in order to adjust memory content from a stochastic state to a machine-tolerable state or an acceptable non-failure state;
   apply a load across the power source; and
   acquire power source information.

2. The automated boot failure prevention and recovery circuit of claim 1, wherein shorting the memory to the ground rewrites memory cells to predefined states.

3. The automated boot failure prevention and recovery circuit of claim 1, wherein:
   the at least one processor is further configured to execute the computer-executable instructions to:
   electrically disconnect the memory from the ground; and
   electrically reconnect the memory to the power source.

4. The automated boot failure prevention and recovery circuit of claim 1, wherein the memory is a static random access memory (SRAM).

5. The automated boot failure prevention and recovery circuit of claim 1, wherein the automated boot failure prevention and recovery circuit is on a motherboard of an electronic computing device.

6. The automated boot failure prevention and recovery circuit of claim 1, wherein the memory contains system firmware of an electronic computing device.

7. A method for preventing or recovering from a boot failure in a logic board, the method comprising:
   electrically disconnecting a memory from a power source;
   shorting the memory to ground for a predetermined period of time while the memory is electrically disconnected from the power source in order to adjust memory content from a stochastic state to a machine-tolerable state or an acceptable non-failure state;
   applying a load across the power source; and
   acquiring power source information.

8. The method of claim 7 further comprising:
   electrically disconnecting the memory from the ground; and
   electrically reconnecting the memory to the power source.

9. The method of claim 7, wherein the memory is a static random access memory (SRAM).

10. The method of claim 7, wherein the logic board is a motherboard of an electronic computing device.

11. The method of claim 7, wherein the memory contains system firmware of an electronic computing device.

12. An electronic device, comprising:
    a battery;
    a static random access memory (SRAM);
    an automated boot failure prevention and recovery circuit coupled between the battery and the SRAM,
    wherein the automated boot failure prevention and recovery circuit comprises:
    one or more non-transitory computer-readable media having computer-executable instructions embodied thereon;

at least one processor coupled to the one or more non-transitory computer-readable media, and configured to execute the computer-executable instructions to:
electrically disconnect the SRAM from the battery;
short the SRAM to ground for a predetermined period of time while the memory is electrically disconnected from the battery in order to adjust content of the SRAM from a stochastic state to a machine-tolerable state or an acceptable non-failure state;
apply a load across the battery; and
acquire battery information.

13. The electronic device of claim 12, wherein shorting the SRAM to the ground rewrites memory cells in the SRAM to predefined states.

14. The electronic device of claim 12, wherein:
the at least one processor is further configured to execute the computer-executable instructions to:
electrically disconnect the SRAM from the ground; and
electrically reconnect the SRAM to the battery.

15. The electronic device of claim 12, wherein:
the automated boot failure prevention and recovery circuit further comprises a switch; and
the at least one processor is configured to execute the computer-executable instructions to send a signal to open the switch to electrically disconnect the SRAM from the battery.

16. The electronic device of claim 12, wherein:
the boot failure prevention control circuit further comprises a switch; and
the at least one processor is configured to execute the computer-executable instructions to send a signal to close the switch to short the SRAM to the ground.

17. The electronic device of claim 12, wherein:
the automated boot failure prevention and recovery circuit further comprises a switch; and
the at least one processor is configured to execute the computer-executable instructions to send a signal to close the switch to apply the load across the battery.

* * * * *